United States Patent
Hung et al.

(10) Patent No.: US 8,982,640 B2
(45) Date of Patent: Mar. 17, 2015

(54) METHOD AND APPARATUS FOR REDUCING ERASE DISTURB OF MEMORY BY USING RECOVERY BIAS

(75) Inventors: Chun Hsiung Hung, Hsinchu (TW);
Bo-Chang Wu, New Taipei (TW);
Kuen-Long Chang, Taipei (TW);
Ken-Hui Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 405 days.

(21) Appl. No.: 13/426,985

(22) Filed: Mar. 22, 2012

(65) Prior Publication Data

US 2013/0250675 A1  Sep. 26, 2013

(51) Int. Cl.
*G11C 11/34* (2006.01)

(52) U.S. Cl.
USPC .............. 365/185.29; 365/185.3; 365/185.09; 365/185.11

(58) Field of Classification Search
USPC ................ 365/185.29, 185.3, 185.09, 185.11
See application file for complete search history.

(56) References Cited

U.S. PATENT DOCUMENTS

| 6,094,373 | A | 7/2000 | Saito |
| 6,842,378 | B2 | 1/2005 | Chang |
| 2014/0063947 | A1* | 3/2014 | Ghodsi ................... 365/185.11 |

* cited by examiner

*Primary Examiner* — Han Yang
(74) *Attorney, Agent, or Firm* — Kenta Suzue; Haynes Beffel & Wolfeld LLP

(57) ABSTRACT

A nonvolatile memory array is divided into multiple memory groups. The nonvolatile memory array receives an erase command to erase a first set of the memory groups, and not a second set of the memory groups. The control circuitry is responsive to the erase command to erase the first set of memory groups, by applying a recovery bias arrangement that adjusts threshold voltages of memory cells in at least one memory group of the second set of memory groups. By applying the recovery bias arrangement to memory cells in at least one memory group of the second set of memory groups, erase disturb is corrected during the recovery bias arrangement, at least in part.

20 Claims, 7 Drawing Sheets

METHOD AND APPARATUS FOR REDUCING ERASE DISTURB OF MEMORY BY USING RECOVERY BIAS

BACKGROUND

Description of Related Art

Erase algorithms of nonvolatile memory cells pre-program erased cells to a programmed state, followed by erase, and then followed by soft program of over-erased cells. The pre-program and soft program are steps additional to an erase step, and correct the threshold voltage distribution of memory cells in parts of a memory array that are selected for erase. However, this erase algorithm does not correct erase disturb of memory cells not selected for erase. Erase disturb refers to the effect of memory cells undergoing a degree of erase despite not being selected for erase.

SUMMARY

The technology described here includes an integrated circuit with a nonvolatile memory array and control circuitry. The nonvolatile memory array is divided into multiple memory groups. The control circuitry is responsive to the erase command to erase a first set of memory groups and not a second set of memory groups, and to apply a recovery bias arrangement that adjusts threshold voltages of memory cells in at least one memory group of the second set of memory groups; the recovery bias arrangement can be applied to at least one memory group of the second set of memory groups to recover from threshold voltage changes caused by erasing the first set of one or more memory groups. An erase bias arrangement is applied prior to the recovery bias arrangement.

By applying the recovery bias arrangement to memory cells in at least one memory group of the second set of memory groups, erase disturb is corrected during the recovery bias arrangement (at least in part). Erase disturb occurs during the erase bias arrangement, as a result of a same well being shared by (i) the first set of memory groups, and (ii) the second set of memory groups.

In some embodiments of the described technology, logic maintains a recovery setting indicative of a number of memory cells of the second set of one or more memory groups in a programmed state that receive the recovery bias arrangement. For example, the recovery setting can indicate an address range of memory cells in memory groups that share a well. The number of memory cells can increase with a number of times the erase bias arrangement is applied (e.g., applied to the nonvolatile memory array or to particular memory groups).

In some embodiments of the described technology, a verify bias arrangement precedes the recovery bias arrangement. Responsive to the verify bias arrangement indicating that at least one memory cell in the second set of memory groups has experienced erase disturb, the control circuitry applies the recovery bias arrangement.

Additional technology described here includes a method. The method comprises at least the following step: responsive to an erase command to erase a first set of one or more memory groups of a nonvolatile memory array and not erase a second set of one or more memory groups of the nonvolatile memory array, applying a recovery bias arrangement that adjusts threshold voltages of memory cells in at least one memory group of the second set of one or more memory groups.

Various embodiments of the technology are described herein.

DETAILED DESCRIPTION

Figure 1:
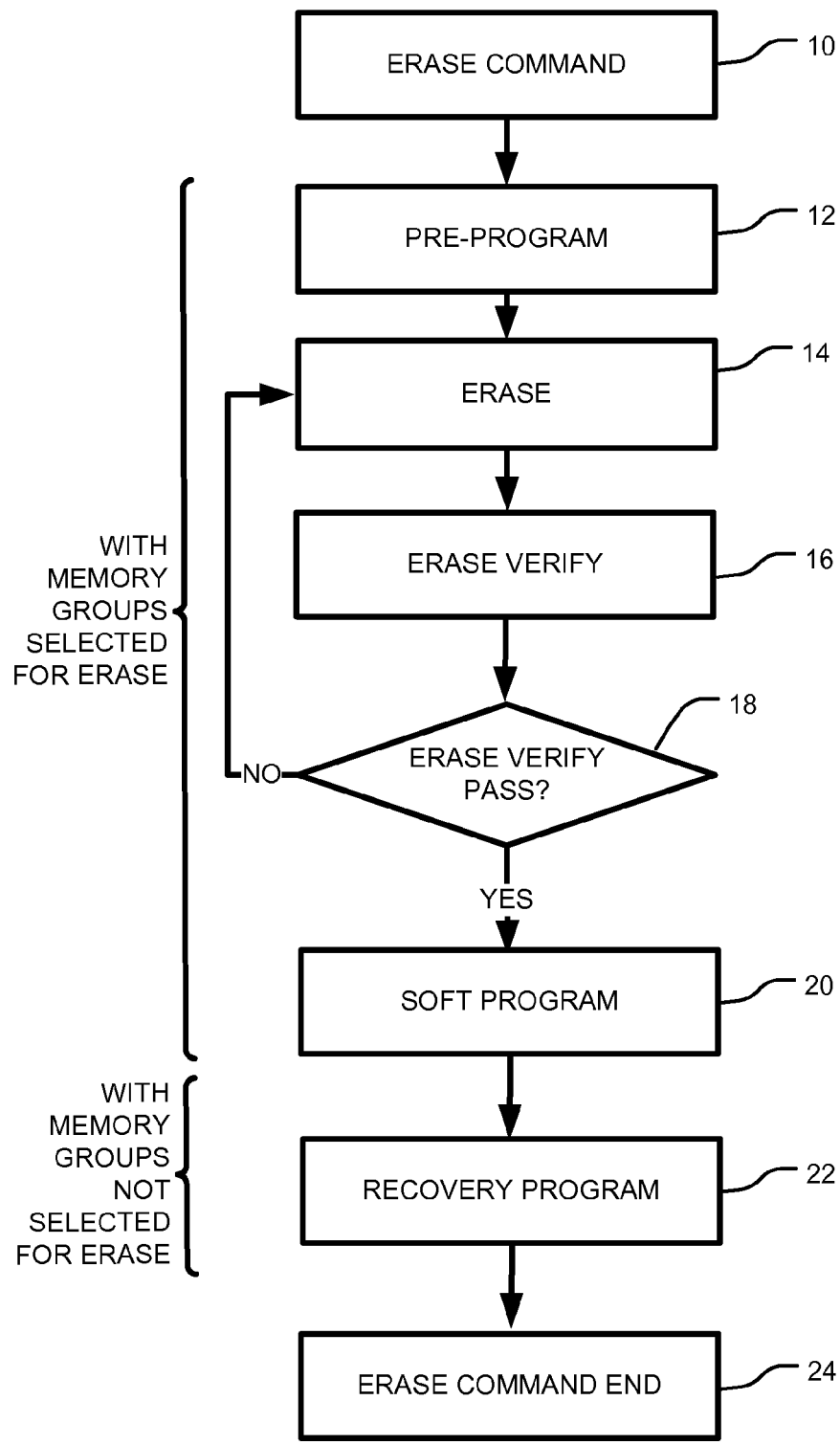
FIG. 1 is an example flowchart of an erase algorithm with recovery programming on memory cells in memory groups that are not selected for erase.

FIG. 1 is an example flowchart of an erase algorithm with recovery programming on memory cells in memory groups that are not selected for erase.

At 10, the erase command is received by the integrated circuit with the memory array. The erase command identifies one or more memory groups for erase. A memory group can be a group of memory cells such as a segment, block, or sector, that are collectively erased together. The group of memory cells can be the whole memory array.

The erase algorithm performs a number of steps with the one or more memory groups selected for erase, and then a number of steps with the one or more memory groups not selected for erase. First, steps are performed with the one or more memory groups selected for erase.

At 12, pre-program is performed on the memory cells—all of them or a subset—in the memory group selected for erase, which are already in the erased state. Such pre-programming brings memory cells in the group of memory cells to a shared programmed state, and prevents memory cells in the erased state from being erased again. At 14, erase then brings all of the memory cells in the group of memory cells selected for erase, from a programmed state shared among the memory cells in the group, to an erased state shared among the memory cells in the group. At 16, erase verify is performed to check whether the preceding erase step sufficiently erased the memory cells in the group of memory cells selected for erase. At 18, if erase verify fails, then the erase algorithm returns to step 14 to repeat erase. At 18, if erase verify passes, then the erase algorithm proceeds. At 20, soft program is performed on the memory cells in the memory group selected for erase, which were over-erased.

The preceding steps were performed on the one or more memory groups selected for erase. The following step is performed on one or more memory groups not selected for erase. During the erase of step 14, in addition to erasing the one or more memory groups selected for erase, erase disturb occurs to one or more memory groups not selected for erase, as discussed below in connection with FIG. 2. Erase disturb is this inadvertent erase of memory groups not selected for erase. At 22, recovery programming is performed to repair the erase disturb on memory cells in memory groups not selected for erase. At 24, the erase command ends.

One programmed state is shown in FIG. 1 by the higher threshold voltage distribution, but other embodiments cover multiple programmed states, such as multi-level cells with 2 bits and 3 levels of programming per memory location, and triple level cell cells with 3 bits or 7 levels of programming per memory location.

Figure 2:
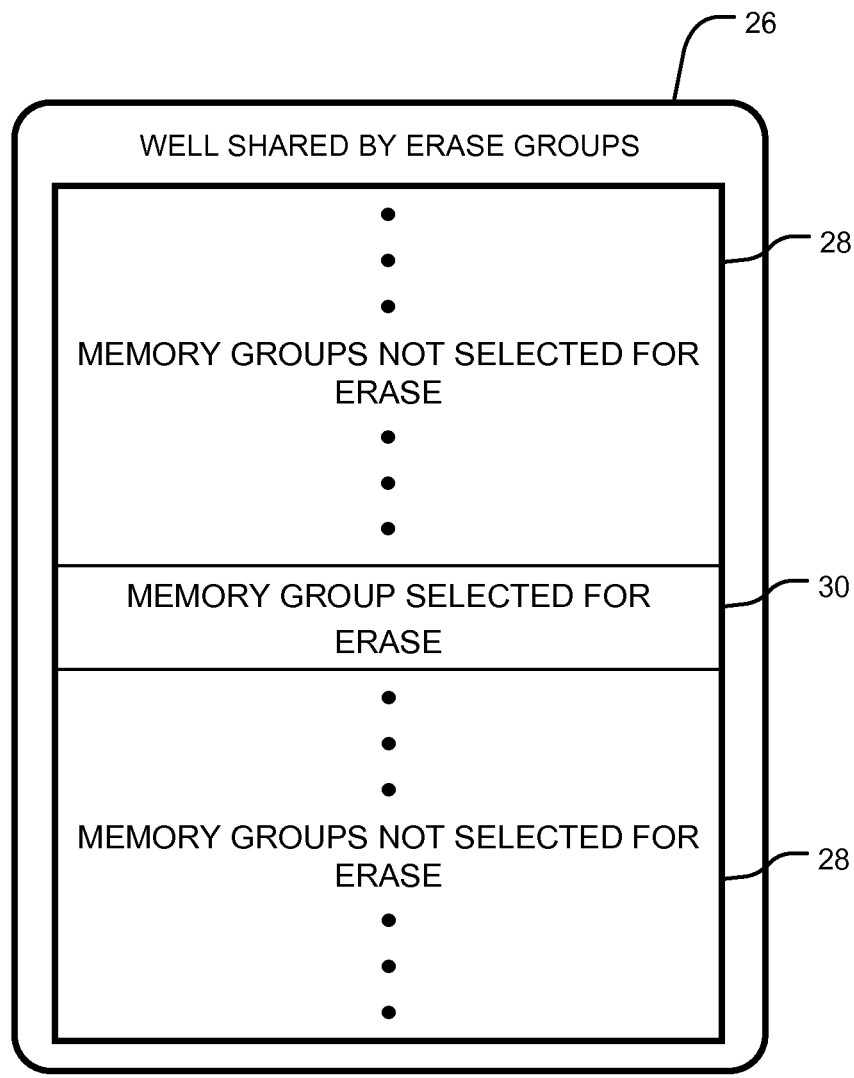
FIG. 2 is an example of a doped well that is shared by multiple erase groups, including both memory groups that are selected for erase and memory groups that are not selected for erase.

FIG. 2 is an example of a doped well that is shared by multiple erase groups, including both memory groups that are selected for erase and memory groups that are not selected for erase. Unfortunately, the multiple erase groups that share the well 26, are exposed to the same large magnitude well potentials during erase, regardless of whether only one of the erase groups is selected for erase. The well 26, which is a p-well (but can be an n-well in other embodiments) is isolated from other such wells. Such isolation between wells addresses the erase disturb problem for memory groups in different wells, but not among memory groups that share the same well. The isolation structures, and a low number of erase groups per well, undesirably increase the size of the array.

One example mechanism of erase disturb is Fowler-Nordheim tunneling of electrons or holes between the well and the charge storage element of the nonvolatile memory cell (e.g., floating gate, dielectric charge trapping element). Such erase disturb can occur, despite different biases on the word lines or gates of memory cells in memory groups selected for erase, and memory cells in memory groups not selected for erase.

Figure 3:
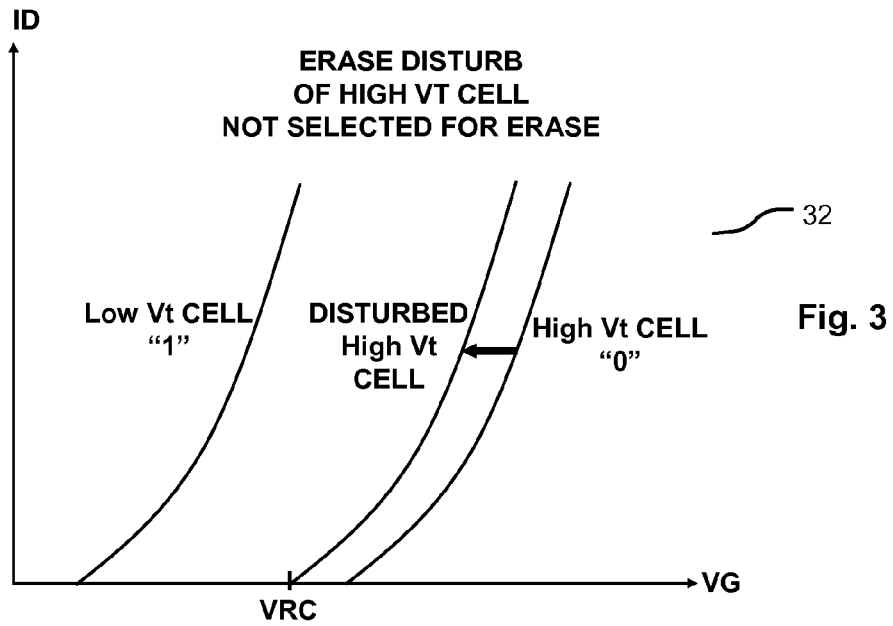
FIG. 3 is a graph of drain current versus gate voltage, showing a memory cell in the low threshold voltage erased state, a memory cell in the high threshold voltage programmed state, and a memory cell that has undergone erase disturb from the high threshold voltage programmed state.
Figure 4:
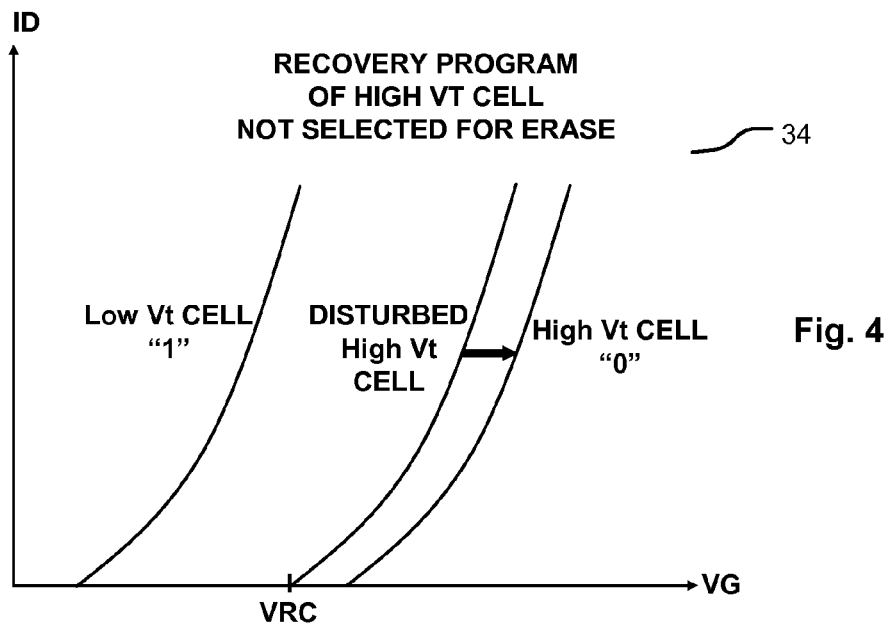
FIG. 4 is a graph of drain current versus gate voltage, showing a memory cell in the low threshold voltage erased state, a memory cell in the high threshold voltage programmed state, and a memory cell that has undergone recovery programming to correct erase disturb and return to the high threshold voltage programmed state.

FIG. 3 is a graph 32 of drain current versus gate voltage, showing a memory cell in the low threshold voltage erased state, a memory cell in the high threshold voltage programmed state, and a memory cell that has undergone erase disturb from the high threshold voltage programmed state. FIG. 4 is a graph 34 of drain current versus gate voltage, showing a memory cell in the low threshold voltage erased state, a memory cell in the high threshold voltage programmed state, and a memory cell that has undergone recovery programming to correct erase disturb and return to the high threshold voltage programmed state.

In FIGS. 3 and 4, the high threshold voltage memory cells are in the programmed state and hold a logical "0" value; and the low threshold voltage memory cells are in the erased state and hold a logical "1" value. During erase of a group of memory cells selected for erase, other groups of memory cells are erase disturbed, such that a degree of erase occurs even to groups of memory cells not selected for erase. In FIG. 3, a memory cell which belongs to a group of memory cells not selected for erase, has the programmed, high threshold voltage state with a logical "0" value. As discussed in connection with FIG. 2, erase disturb occurs, because a same well is shared by the group of memory cells not selected for erase and the group of memory cells selected for erase.

Accordingly, FIG. 3 shows a threshold voltage shift resulting from erase disturb of the memory cell having the programmed, high threshold voltage state with a logical "0" value. The erase disturbed memory cell shows a negative threshold voltage shift, resulting from a net positive shift in charge stored on the charge storage element of the erase disturbed memory cell. For example, electrons may have moved from the charge storage element of the erase disturbed memory cell to the shared well (or holes may have moved from the shared well to the charge storage element of the erase disturbed memory cell). In this example, the shared well has a relatively high positive voltage to attract the electrons from the charge storage element of the erase disturbed memory cell to the shared well.

FIG. 4 shows a threshold voltage shift resulting from recovery programming of the memory cell which was erase disturbed in FIG. 3. The recovery programmed memory cell shows a positive threshold voltage shift, resulting from a net negative shift in charge stored on the charge storage element of the recovery programmed memory cell. For example, electrons may have moved from the shared well to the charge storage element of the erase disturbed memory cell (or holes may have moved from the charge storage element of the erase disturbed memory cell to the shared well). In this example, the shared well has a relatively high negative voltage to repel the electrons from the shared well to the charge storage element of the erase disturbed memory cell.

Figure 5:
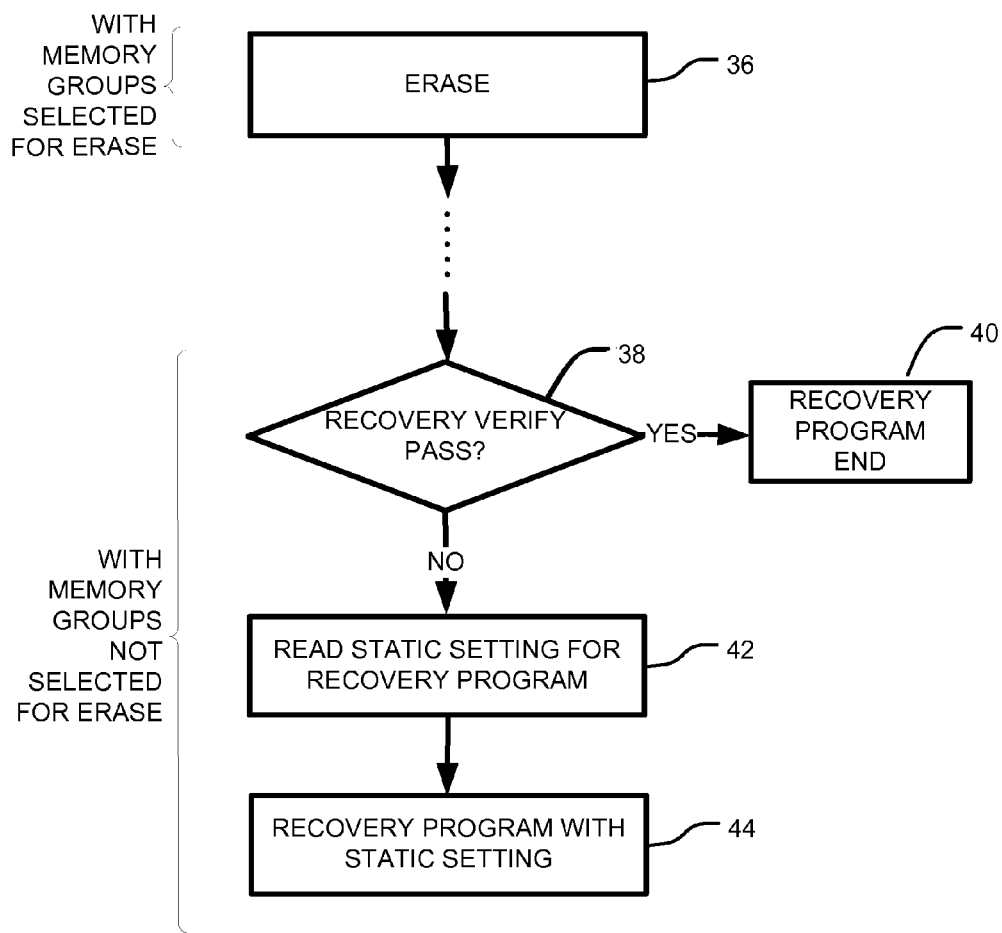
FIG. 5 is an example flowchart of part of an erase algorithm with recovery programming based on a static setting that determines the scope of recovery programming.
Figure 6:
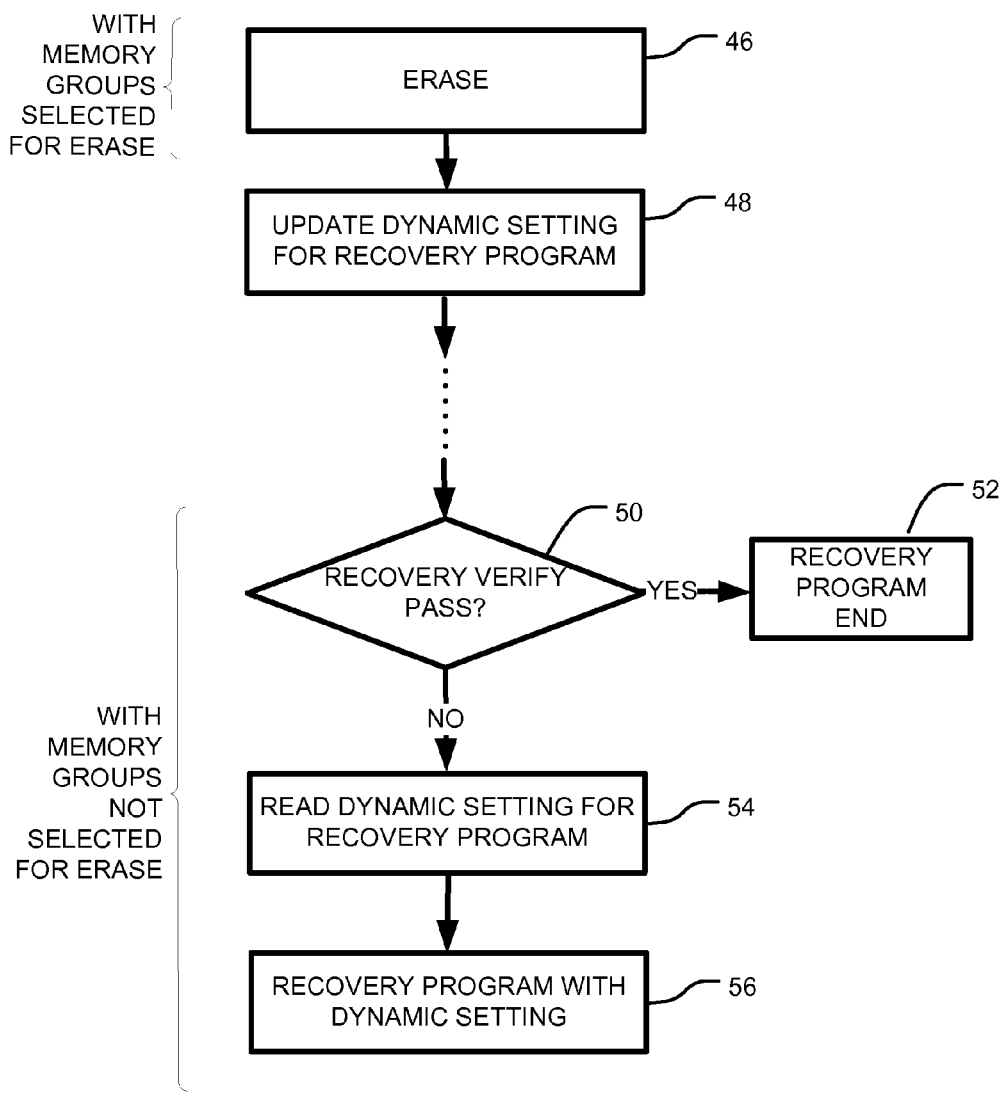
FIG. 6 is an example flowchart of part of an erase algorithm with recovery programming based on a dynamic setting that determines the scope of recovery programming.

FIGS. 5 and 6 are flowcharts that show more detail of alternatives of the recovery programming step in the erase algorithm, such as recovery program step 22 in FIG. 1. FIG. 5 is an example flowchart of part of an erase algorithm with recovery programming based on a static setting that determines the scope of recovery programming. FIG. 6 is an example flowchart of part of an erase algorithm with recovery programming based on a dynamic setting that determines the scope of recovery programming.

In FIG. 5, at 36 erase is performed. The ellipsis indicates other steps being performed on memory cells selected for erase, such as pre-program, erase verify, and soft program as discussed in connection with FIG. 1.

The subsequent steps are performed on memory groups that are not selected for erase. At 38, recovery verify is performed. If recovery verify passes, then recovery programming is unnecessary, and at 40 recovery programming ends (along with the erase algorithm ending). Recovery verify passing, indicates that erase disturb effects on a programmed memory cell were sufficiently small, such that the threshold voltage shift from erase disturb was not significant enough to continue with recovery programming. If recovery verify fails, then recovery programming continues. At 42, a static setting is read for recovery programming. The static setting is indicative of a number of the memory cells to be recovery programmed, such as an address range of memory cells of memory groups that share a well. The static setting can be based on a semiconductor manufacturing process of the nonvolatile memory array, or an application of the nonvolatile memory array. The static setting can be saved in a memory such as a nonvolatile memory or a fuse. At 44, recovery programming is performed on the erase disturbed memory cells, according to the static setting.

In FIG. 6, at 46 erase is performed. The ellipsis indicates other steps being performed on memory cells selected for erase, such as pre-program, erase verify, and soft program as discussed in connection with FIG. 1. At 48, a dynamic setting is updated in memory, such as a nonvolatile memory, counter, or register in control circuitry. The dynamic setting reflects the number of erase operations that have been performed (e.g. on the memory array). Memory cells degrade with the number of program-erase cycles. As the number of erase operations that have been performed increases, the dynamic setting increases such that recovery programming is performed on an increasing number of memory cells, or a larger memory address range, in memory groups that were not selected for erase.

The subsequent steps are performed on memory groups that are not selected for erase. At 50, recovery verify is performed on a cell-by-cell basis. If recovery verify passes, then recovery programming is unnecessary, and at 52 recovery programming ends (along with the erase algorithm ending). Recovery verify passing, indicates that erase disturb effects on a programmed memory cell were sufficiently small, such that the threshold voltage shift from erase disturb was not significant enough to continue with recovery programming. If recovery verify fails, then recovery programming continues on a cell-by-cell basis. At 54, a dynamic setting is read for recovery programming. The dynamic setting is indicative of a number of the memory cells to be recovery programmed, such as an address range of memory cells of memory groups that share a well. The static setting can be based on a semiconductor manufacturing process of the nonvolatile memory array, or an application of the nonvolatile memory array. The dynamic setting can be saved in a memory such as a nonvolatile memory counter, or register in control circuitry. At 56, recovery programming is performed on the erase disturbed memory cells, according to the dynamic setting.

Figure 7:
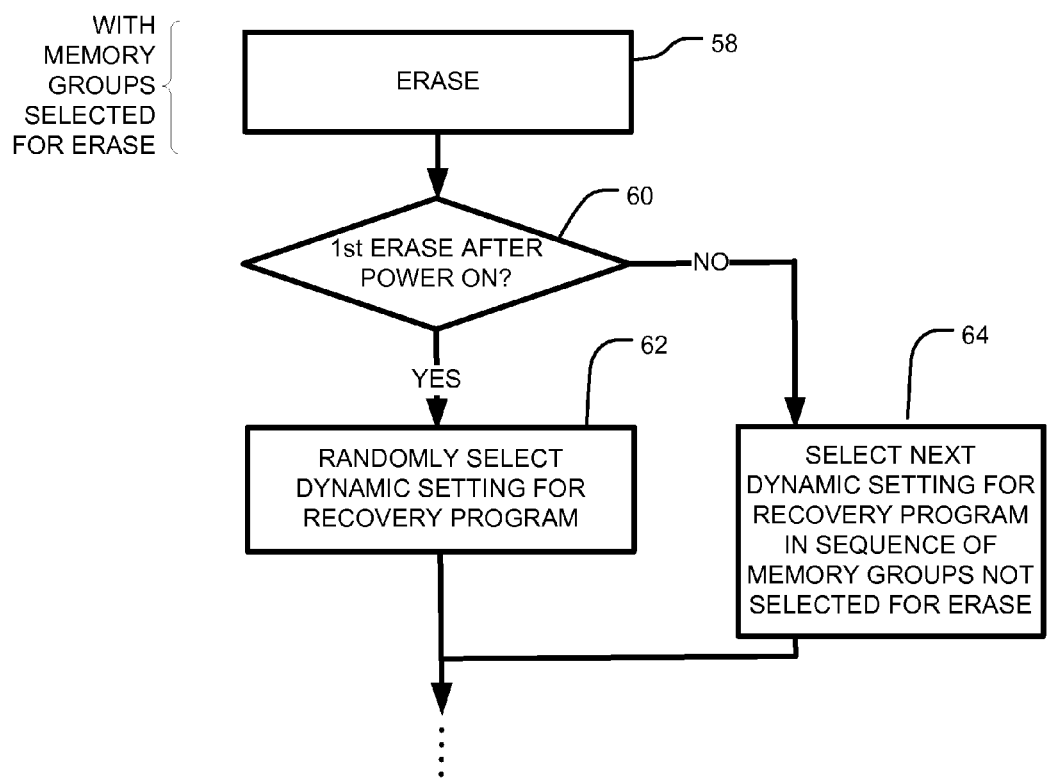
FIG. 7 is an example flowchart of part of an erase algorithm with recovery programming based on a dynamic setting that determines the scope of recovery programming.

In FIG. 7, at 58 erase is performed. The later ellipsis indicates other steps being performed on memory cells selected for erase, such as pre-program, erase verify, and soft program as discussed in connection with FIG. 1; or steps performed on memory cells not selected for erase.

The following is an example of a dynamic setting being updated. In some embodiments, the dynamic setting reflects the starting position or starting memory address of recovery programming.

Step 60 determines whether the erase procedure is the first erase procedure performed after power on. In various embodiments, the erase procedure is the first performed on the entire array, or on the particular memory group which is identified to be erased by the erase command.

If the erase procedure is the first erase procedure performed after power on, then at 62 the dynamic setting selects a beginning memory address out of the memory groups sharing the well, for example as shown in FIG. 2. If the erase procedure is the second or subsequent erase procedure performed after power on, then at 62 the next beginning memory address is selected out of a sequence of memory groups sharing the well, for example as shown in FIG. 2.

Figure 8:
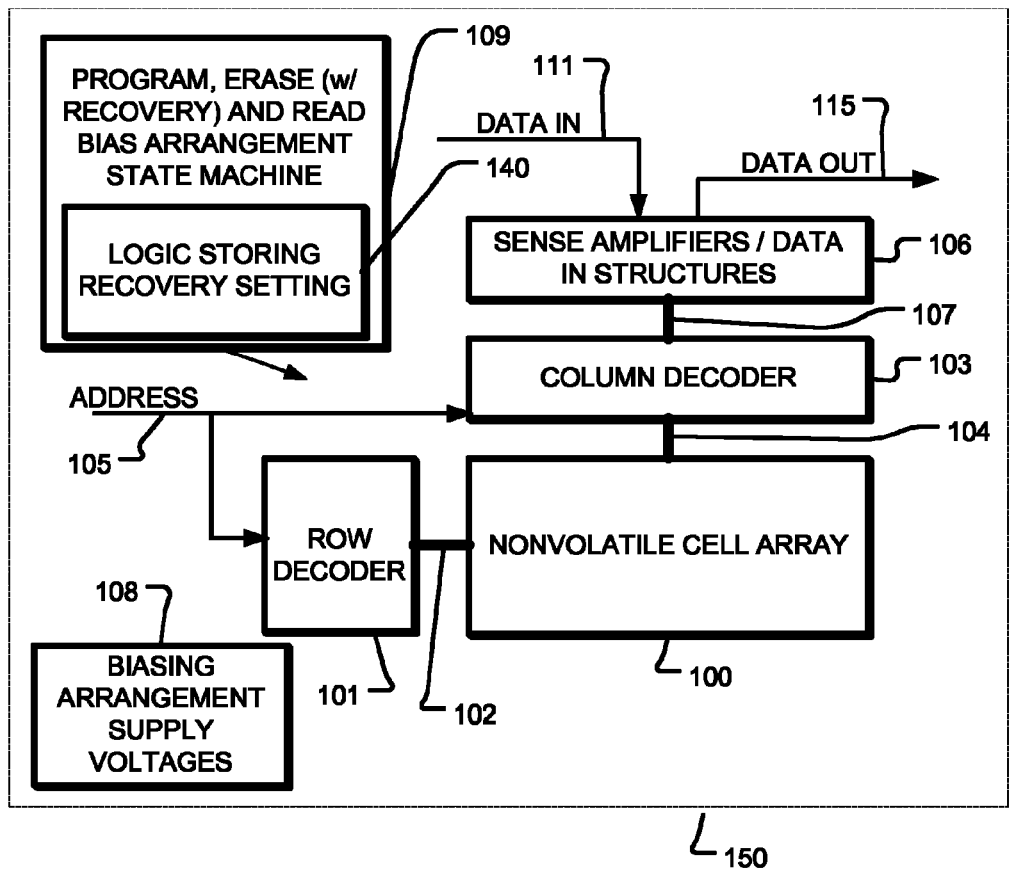
FIG. 8 is a block diagram of an integrated circuit with a memory array and improvements described herein.

FIG. 8 is a block diagram of an integrated circuit with a memory array and improvements described herein. An integrated circuit 150 includes a memory array 100. A word line (or row) and block select decoder 101 is coupled to, and in electrical communication with, a plurality of word lines 102, and arranged along rows in the memory array 100. A bit line (column) decoder and drivers 103 are coupled to and in electrical communication with a plurality of bit lines 104 arranged along columns in the memory array 100 for reading data from, and writing data to, the memory cells in the memory array 100. Addresses are supplied on bus 105 to the word line decoder and drivers 101 and to the bit line decoder 103. Sense amplifiers and data-in structures in block 106, are coupled to the bit line decoder 103 via the bus 107. Data is supplied via the data-in line 111 from input/output ports on the integrated circuit 150, to the data-in structures in block 106. Data is supplied via the data-out line 115 from the sense amplifiers in block 106 to input/output ports on the integrated circuit 150, or to other data destinations internal or external to the integrated circuit 150. Program, erase, and read bias arrangement state machine circuitry 109 controls biasing arrangement supply voltages 108, and applies a recovery bias arrangement during erase. State machine circuitry 109 also includes logic 140 that stores a recovery setting and determines a scope (such as a range of memory cells) of recovery bias during erase.

The disclosed technology is applicable to nonvolatile memory arrays such as a NOR array. Example nonvolatile memory elements are floating gate elements and dielectric charge trapping memory elements.

The disclosed technology applies a recovery bias arrangement that adjusts threshold voltages, upward or downward depending on the embodiment.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
    a nonvolatile memory array with a plurality of memory groups; a recovery setting memory; and
    control circuitry to erase a first set of one or more memory groups and not erase a second set of one or more memory groups, and to apply a recovery bias arrangement that adjusts threshold voltages of memory cells in at least one memory group of the second set of one or more memory groups wherein the control circuitry updates the recovery setting memory to indicate an increasing number of erase operations performed on the nonvolatile memory array, and the control circuitry applies the recovery bias arrangement on an increasing number of memory cells in the nonvolatile memory array as the dynamic setting memory stores the increasing number o erase operations performed on the nonvolatile memory array.

2. The integrated circuit of claim 1, further comprising:
    logic that maintains a recovery setting indicative of a number of memory cells of the second set of one or more memory groups in a programmed state that receive the recovery bias arrangement to recover from threshold voltage changes caused by erasing the first set of one or more memory groups.

3. The integrated circuit of claim 1, further comprising:
    logic that maintains a recovery setting indicative of a number of memory cells of the second set of one or more memory groups in a programmed state that receive the recovery bias arrangement to recover from threshold voltage changes caused by erasing the first set of one or more memory groups, and the number of memory cells increases with a number of times the erase bias arrangement is applied.

4. The integrated circuit of claim 1, further comprising:
    logic that maintains a recovery setting indicative of a number of memory cells of the second set of one or more memory groups in a programmed state that receive the recovery bias arrangement to recover from threshold voltage changes caused by erasing the first set of one or more memory groups, and the number of memory cells increases with a number of times the erase bias arrangement is applied to the nonvolatile memory array.

5. The integrated circuit of claim 1,
    wherein the control circuitry is responsive to an erase command, by applying an erase bias arrangement prior to the recovery bias arrangement.

6. The integrated circuit of claim 1,
wherein a same well is shared by: (i) the first set of one or more memory groups, and (ii) the at least one memory group of the second set of one or more memory groups.

7. The integrated circuit of claim 1,
wherein the control circuitry responsive to an erase command, by applying an erase bias arrangement to the first set of one or more memory groups prior to the recovery bias arrangement, and during the erase bias arrangement erase disturb occurs to the second set of one or more memory groups, and during the recovery bias arrangement the erase disturb is at least partly corrected.

8. The integrated circuit of claim 1,
wherein a same well is shared by: (i) the first set of one or more memory groups, and (ii) the at least one memory group of the second set of one or more memory groups,
wherein the control circuitry responsive to an erase command, by applying an erase bias arrangement to the first set of one or more memory groups prior to the recovery bias arrangement, and during the erase bias arrangement erase disturb occurs to the second set of one or more memory groups due to the same well being shared by the first set of one or more memory groups undergoing erase and the second set of one or more memory groups not undergoing erase, and during the recovery bias arrangement the erase disturb is at least partly corrected.

9. The integrated circuit of claim 1,
wherein the control circuitry is responsive to an erase command, by applying a verify bias arrangement, and the control circuitry applies the recovery bias arrangement responsive to the verify bias arrangement indicating that at least one memory cell in the second set of one or more memory groups has experienced erase disturb.

10. The integrated circuit of claim 1,
wherein the recovery bias arrangement is applied to recover from threshold voltage changes of memory cells in at least one memory group of the second set of one or more memory groups, the threshold voltage changes caused by erasing the first set of one or more memory groups.

11. A method, comprising:
responsive to an erase command to erase a first set of one or more memory groups of a nonvolatile memory array and not erase a second set of one or more memory groups of the nonvolatile memory array, applying a recovery bias arrangement that adjusts threshold voltages of memory cells in at least one memory group of the second set of one or more memory groups updating a recovery setting memory to indicate an increasing number of erase operations performed on the nonvolatile memory array; and responsive to the dynamic setting memory storing the increasing number of erase perations performed on the nonvolatile memory array, applying the recovery bias arrangement on an increasing number of memory cells in the nonvolatile memory array.

12. The method of claim 10, wherein the recovery bias arrangement is applied according to a recovery setting indicative of a number of memory cells of the second set of one or more memory groups in a programmed state that receive the recovery bias arrangement to recover from threshold voltage changes caused by erasing the first set of one or more memory groups.

13. The method of claim 10, wherein the recovery bias arrangement is applied according to a recovery setting indicative of a number of memory cells of the second set of one or more memory groups in a programmed state that receive the recovery bias arrangement to recover from threshold voltage changes caused by erasing the first set of one or more memory groups, and the number of memory cells increases with a number of times the erase bias arrangement is applied.

14. The method of claim 10, wherein the recovery bias arrangement is applied according to a recovery setting indicative of a number of memory cells of the second set of one or more memory groups in a programmed state that receive the recovery bias arrangement to recover from threshold voltage changes caused by erasing the first set of one or more memory groups, and the number of memory cells increases with a number of times the erase bias arrangement is applied to the nonvolatile memory array.

15. The method of claim 10, further comprising:
responsive to the erase command, applying an erase bias arrangement to the first set of one or more memory groups prior to the recovery bias arrangement.

16. The method of claim 10,
wherein a same well is shared by: (i) the first set of one or more memory groups, and (ii) the at least one memory group of the second set of one or more memory groups.

17. The method of claim 10,
at least partly correcting erase disturb during the recovery bias arrangement, the erase disturb occurring to the second set of one or more memory groups during an erase bias arrangement applied to the first set of one or more memory groups prior to the recovery bias arrangement.

18. The method of claim 10, wherein
at least partly correcting erase disturb during the recovery bias arrangement, the erase disturb occurring to the second set of one or more memory groups during an erase bias arrangement applied prior to the recovery bias arrangement, the erase disturb being due to a same well being shared by the first set of one or more memory groups undergoing erase and the second set of one or more memory groups not undergoing erase.

19. The method of claim 10, further comprising:
applying the recovery bias arrangement responsive to a verify bias arrangement indicating that at least one memory cell in the second set of one or more memory groups has experienced erase disturb.

20. The method of claim 10, wherein
the recovery bias arrangement is applied to recover from threshold voltage changes of memory cells in at least one memory group of the second set of one or more memory groups, the threshold voltage changes caused by erasing the first set of one or more memory groups.

* * * * *

UNITED STATES PATENT AND TRADEMARK OFFICE
CERTIFICATE OF CORRECTION

PATENT NO.       : 8,982,640 B2
APPLICATION NO.  : 13/426985
DATED            : March 17, 2015
INVENTOR(S)      : Chun-Hsiung Hung et al.

It is certified that error appears in the above-identified patent and that said Letters Patent is hereby corrected as shown below:

In the claims

In claim 1, column 6, line 37, delete the letter "o" and insert the word -- of --.

In claim 11, column 7, line 52, delete the word "perations" and insert the word -- operations --.

Signed and Sealed this
First Day of December, 2015

Michelle K. Lee
*Director of the United States Patent and Trademark Office*